(12) United States Patent
Thirupapuliyur et al.

(10) Patent No.: US 8,330,225 B2
(45) Date of Patent: Dec. 11, 2012

(54) NMOS TRANSISTOR DEVICES AND METHODS FOR FABRICATING SAME

(75) Inventors: Sunderraj Thirupapuliyur, San Jose, CA (US); Faran Nouri, Los Altos, CA (US); Yonah Cho, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/190,957

(22) Filed: Jul. 26, 2011

(65) Prior Publication Data

US 2011/0278651 A1   Nov. 17, 2011

Related U.S. Application Data

(62) Division of application No. 12/763,403, filed on Apr. 20, 2010, now Pat. No. 7,994,015.

(60) Provisional application No. 61/171,123, filed on Apr. 21, 2009.

(51) Int. Cl.
*H01L 29/94* (2006.01)
*H01L 31/062* (2006.01)
*H01L 31/113* (2006.01)
*H01L 31/119* (2006.01)

(52) U.S. Cl. ........................... 257/368; 257/408

(58) Field of Classification Search .......... 257/368–378, 257/408, E21.409, E29.255
See application file for complete search history.

(56) References Cited

U.S. PATENT DOCUMENTS

| | | | |
|---|---|---|---|
| 6,358,806 B1 | 3/2002 | Puchner | |
| 6,849,527 B1 | 2/2005 | Xiang | |
| 7,005,333 B2 | 2/2006 | Li | |
| 7,115,945 B2 | 10/2006 | Lee et al. | |
| 7,132,338 B2 | 11/2006 | Samoilov et al. | |
| 7,170,084 B1 | 1/2007 | Xiang et al. | |
| 7,235,822 B2 | 6/2007 | Li | |
| 7,462,542 B2 | 12/2008 | Liu et al. | |
| 7,759,199 B2 * | 7/2010 | Thomas et al. | 438/269 |
| 2004/0256647 A1 | 12/2004 | Lee et al. | |
| 2005/0255667 A1 | 11/2005 | Arghavani et al. | |
| 2005/0287752 A1 | 12/2005 | Nouri et al. | |
| 2007/0057287 A1 | 3/2007 | Lin et al. | |
| 2007/0132054 A1 | 6/2007 | Arghavani et al. | |
| 2007/0207596 A1 | 9/2007 | Kim et al. | |
| 2007/0259503 A1 | 11/2007 | Chang et al. | |
| 2008/0057655 A1 | 3/2008 | Liu et al. | |
| 2008/0138939 A1 | 6/2008 | Kim | |
| 2008/0138955 A1 | 6/2008 | Ye et al. | |
| 2008/0138964 A1 | 6/2008 | Ye et al. | |

* cited by examiner

*Primary Examiner* — Cuong Q Nguyen
(74) *Attorney, Agent, or Firm* — Alan Taboada; Moser Taboada

(57) ABSTRACT

NMOS transistors having controlled channel strain and junction resistance and methods for the fabrication of same are provided herein. In some embodiments, an NMOS transistor may include a transistor stack comprising a gate dielectric and a gate electrode formed atop a p-type silicon region; and a source/drain region disposed on both sides of the transistor stack and defining a channel region therebetween and beneath the transistor stack, the source drain region including a first silicon layer having a lattice adjusting element and one or more second silicon layers having a lattice adjusting element and an n-type dopant disposed atop the first silicon layer.

19 Claims, 7 Drawing Sheets

NMOS TRANSISTOR DEVICES AND METHODS FOR FABRICATING SAME

CROSS-REFERENCE TO RELATED APPLICATIONS

This application is a divisional of U.S. patent application Ser. No. 12/763,403, filed Apr. 20, 2010 now U.S. Pat. No. 7,994,015, which claims benefit of U.S. provisional patent application Ser. No. 61/171,123, filed Apr. 21, 2009. Each of the aforementioned related patent applications is herein incorporated by reference.

BACKGROUND OF THE INVENTION

1. Field of the Invention

Embodiments of the present invention generally relate to the field of semiconductor manufacturing processes and devices, and more particularly, to methods of depositing silicon-containing films to form semiconductor devices.

2. Description of the Related Art

As smaller transistors are manufactured, source/drain regions for sub-100 nm complementary metal-oxide semiconductor (CMOS) devices, such as silicon-containing metal oxide semiconductor field effect transistor (MOSFET) devices, are becoming more challenging to produce. Such MOSFET transistors may include p-channel MOS transistors, and n-channel MOS transistors. The PMOS transistor has a p-type source/drain region separated by an n-type channel (e.g., holes are responsible for conduction in the channel between the source/drain regions). The NMOS transistor has an n-type source/drain region separated by a p-type channel (e.g., electrons are responsible for conduction in the channel between the source/drain regions).

In NMOS applications, a source/drain region may be formed by etching a silicon substrate to make a recess that may be filled with a selectively grown silicon-carbon layer. The silicon-carbon layer is then doped with a dopant element to form the n-type source/drain region. In some embodiments, the silicon-carbon layer may also be used to increase the tensile strain in the channel of an NMOS transistor device (e.g., the mismatch of lattice constants between silicon and the SiC material generates a tensile stress which may be transferred in the lateral dimension to create tensile strain in channel of an NMOS device). The increased tensile strain improves the mobility of electrons in the channel of the device.

However, the silicon-carbon layer cannot be easily doped with dopant elements and retains a high percentage of carbon in the silicon-carbon film. Specifically, the diffusion of the dopant in the silicon-carbon layer is significantly retarded by the presence of carbon atoms at the substitutional lattice sites, which undesirably results in increased junction resistivity in the device (thereby offsetting the effect of the increased strain). Furthermore, doping of silicon-carbon with the dopant element significantly decreases the percentage of carbon in the doped silicon-carbon layer, which undesirably reduces the strain, and the electron mobility, in the channel of the NMOS device.

Thus, there is a need for improved methods for fabricating source/drain regions of NMOS transistor devices.

SUMMARY OF THE INVENTION

NMOS transistors having controlled channel strain and junction resistance and methods for the fabrication of same are provided herein. In some embodiments, a method for forming an NMOS transistor may include providing a substrate having a p-type silicon region and a gate stack disposed thereon, the gate stack partially defining a source and a drain region; depositing an undoped first silicon layer having a lattice adjusting element atop the p-type silicon region and within the source and the drain regions; and depositing a second silicon layer having a lattice adjusting element and an n-type dopant atop the undoped first silicon layer.

In some embodiments, the substrate may comprise a partially fabricated NMOS transistor device having a source/drain area defined therein. In some embodiments, the substrate may comprise a partially fabricated NMOS transistor device with a partially etched region of an existing source/drain area defined therein. The first silicon layer may be deposited within the source/drain area or partially etched region of the substrate. At least one second silicon layers may be deposited atop of the first silicon layer.

In some embodiments, a plurality of second silicon layers may be deposited atop the first silicon layer. In some embodiments, the concentration of the lattice adjusting element may be greater in a bottom layer of the plurality of second silicon layers than in a top layer of the plurality of second silicon layers. In some embodiments, the concentration of the n-type dopant may be greater in the top layer of the plurality of second silicon layers than in the bottom layer of the plurality of second silicon layers.

In some embodiments, an NMOS transistor may include a transistor stack formed atop a p-type silicon region; and a source/drain region disposed on both sides of the transistor stack and defining a channel region therebetween and beneath the transistor stack, the source drain region including a first silicon layer having a lattice adjusting element and one or more second silicon layers having a lattice adjusting element and an n-type dopant disposed atop the first silicon layer. In some embodiments, the NMOS transistor may be fabricated using the methods described herein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

NMOS transistor devices having controlled channel strain and junction resistance and methods for the fabrication of same are provided herein. NMOS transistor devices and method of fabrication disclosed herein advantageously provide high channel strain and with low junction resistance.

Figure 1:
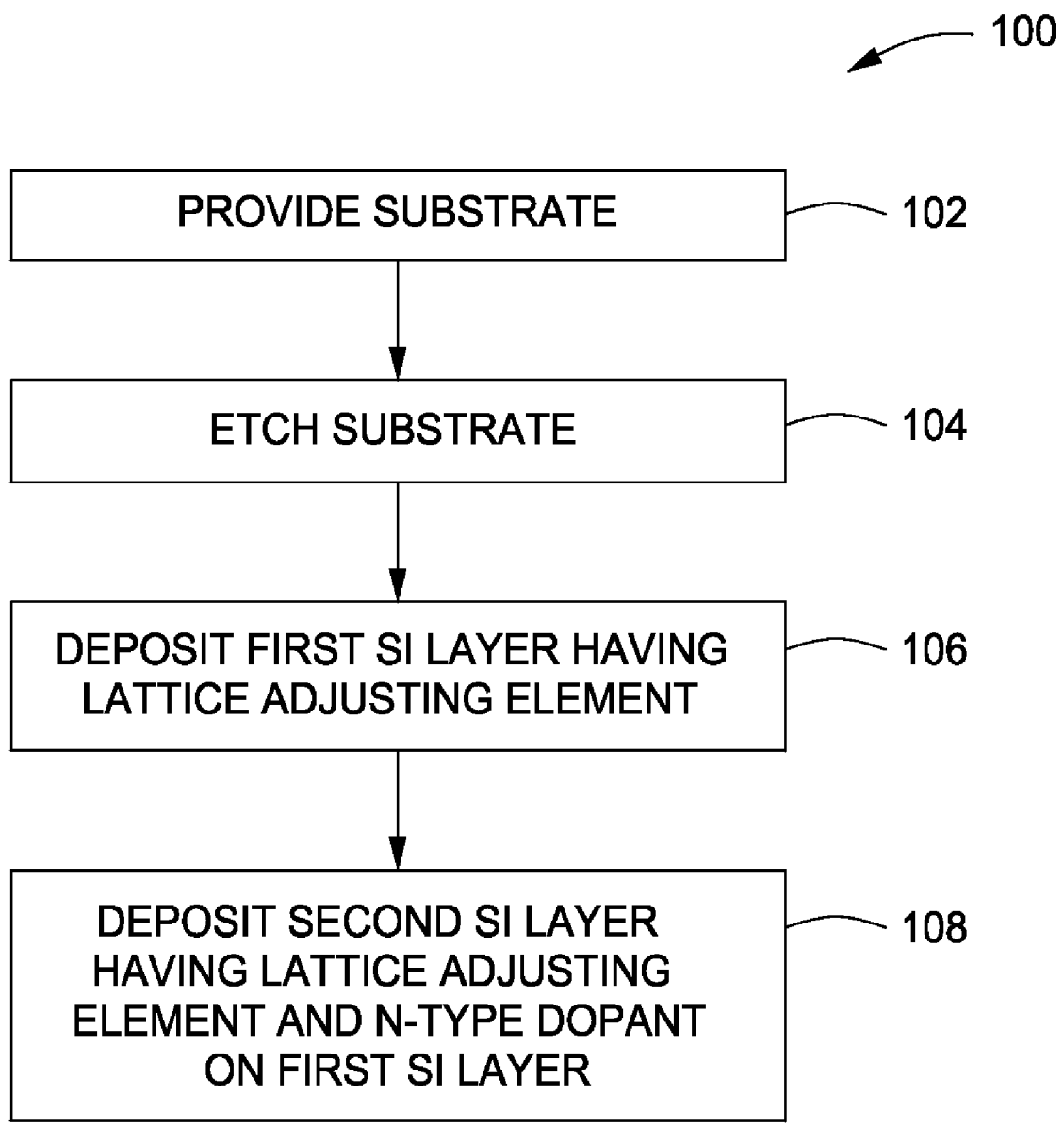
FIG. 1 depicts a flow chart of a method for deposition of a source/drain region in accordance with some embodiments of the present invention.

FIG. 1 depicts a method 100 of fabricating source/drain regions in NMOS transistor devices in accordance with some embodiments of the present invention. The method 100 is illustratively described with reference to FIGS. 2A-D, which depicts stages of fabrication of the NMOS transistor device in accordance with the embodiments of the method 100. The methods described herein may be performed in a suitable epitaxial deposition chamber, such as the RP EPI® process chamber, available from Applied Materials, Inc. of Santa Clara, Calif., or other suitable deposition chamber, such as described below with respect to FIG. 4. The deposition chamber, along with other chambers suited for the fabrication of the NMOS transistor device (e.g., etch chambers, cleaning chamber, and the like) may be part of a cluster tool, such as one of the CENTURA® line of cluster tools, also available from Applied Materials, Inc. One example of a suitable cluster tool is described below with respect to FIG. 5.

Figure 2A:
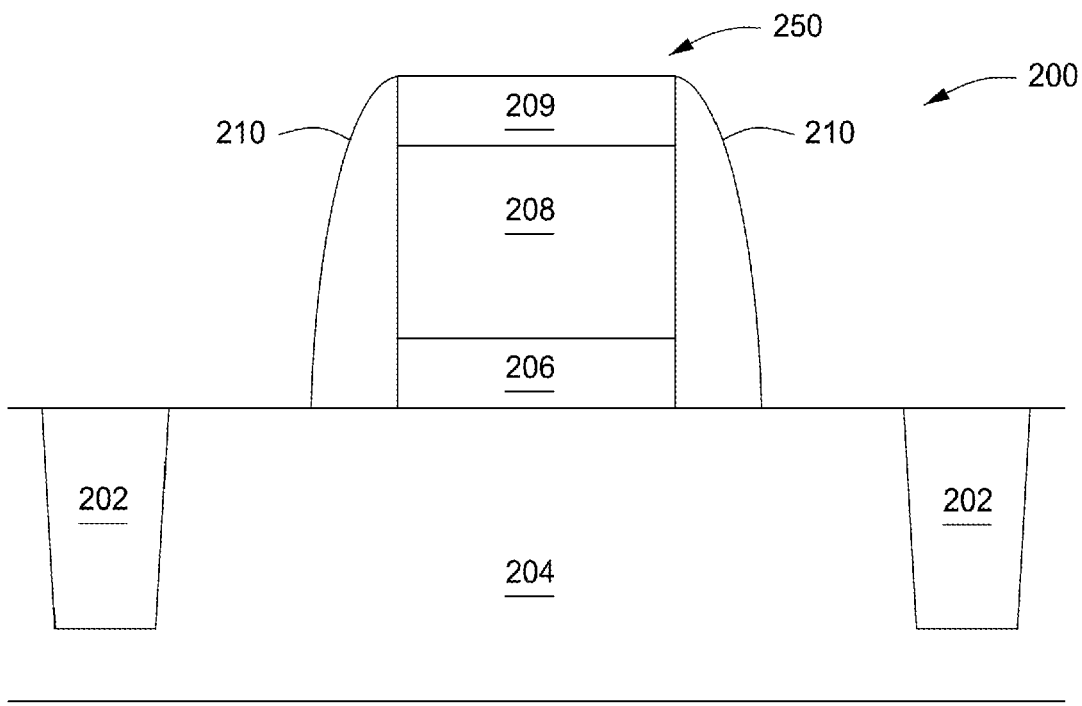
FIGS. 2A-D depict stages of fabrication of a source/drain region in accordance with some embodiments of the method of FIG. 1.

The process 100 generally begins at 102, where a substrate 200 may be provided (as shown in FIG. 2A). The substrate 200 may comprise a material such as crystalline silicon, silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 200 comprises silicon.

In some embodiments, the substrate 200 may include other structures or layers at least partially formed thereon. For example, as shown in FIG. 2A, the substrate 200 may include a p-type region 204 defined therein and having a gate stack 250 partially fabricated atop the p-type region 204. In some embodiments, such as where one or more transistors are being formed on the substrate 200, a plurality of field isolation regions 202 may be formed in the substrate 200 to isolate wells having different conductivity types (e.g., n-type or p-type) and/or to isolate adjacent transistors. The field isolation regions 202 may be shallow trench isolation (STI) structures formed, for example, by etching a trench into the substrate 200 and then filling the trench with a suitable insulator, such as silicon oxide (oxide), silicon nitride (nitride), or the like.

The p-type region 204 may be formed by one or more implant processes using a suitable dopant, such as boron, or indium into the substrate 200. The p-type region 204 may also be formed by other means including providing an initially doped substrate, or depositing an in situ doped semiconductor material with a desired conductivity. The p-type region 204 may have a doping density, for example, of between about $5 \times 10^{16}$ atoms/cm$^3$ and about $5 \times 10^{19}$ atoms/cm$^3$.

The gate stack 250 may include a gate dielectric layer 206 formed on the substrate 200 atop the p-type region 204. The gate dielectric layer 206 may comprise, for example, one or more silicon oxide, silicon nitride, or silicon oxynitride layers, which, for example, may be deposited to a thickness between about 0.5 nm and about 20 nm. A gate electrode 208 may be formed on the gate dielectric layer 206. The gate electrode 208 may be formed from suitable conductive materials, such as metals, polysilicon, or the like. In some embodiments, the gate electrode may be between about 100 nm and about 350 nm thick. A hard mask layer 209 may be deposited atop the gate electrode 208 to protect the gate electrode 208 during etching as described below at 104.

Sidewall spacers 210 may be formed along the outer sidewalls of the hard mask layer 209, the gate electrode 208 and the gate dielectric layer 206. The sidewall spacers 210 may be formed, for example, to a thickness between about 5 nm and about 30 nm, or any other thickness suitable to electrically isolate the gate electrode 208 from subsequently deposited material. The sidewall spacers 210 may comprise suitable insulating materials, for example, silicon nitride, silicon oxide, silicon oxynitride, silicon carbide, or the like. The sidewall spacers 210 may be deposited by any suitable process, such as chemical vapor deposition, and may be formed such that outer edges of the sidewall spacers 210 taper near the topmost surface of the gate electrode 208 and hard mask layer 209, as shown in FIG. 2A.

Figure 2B:
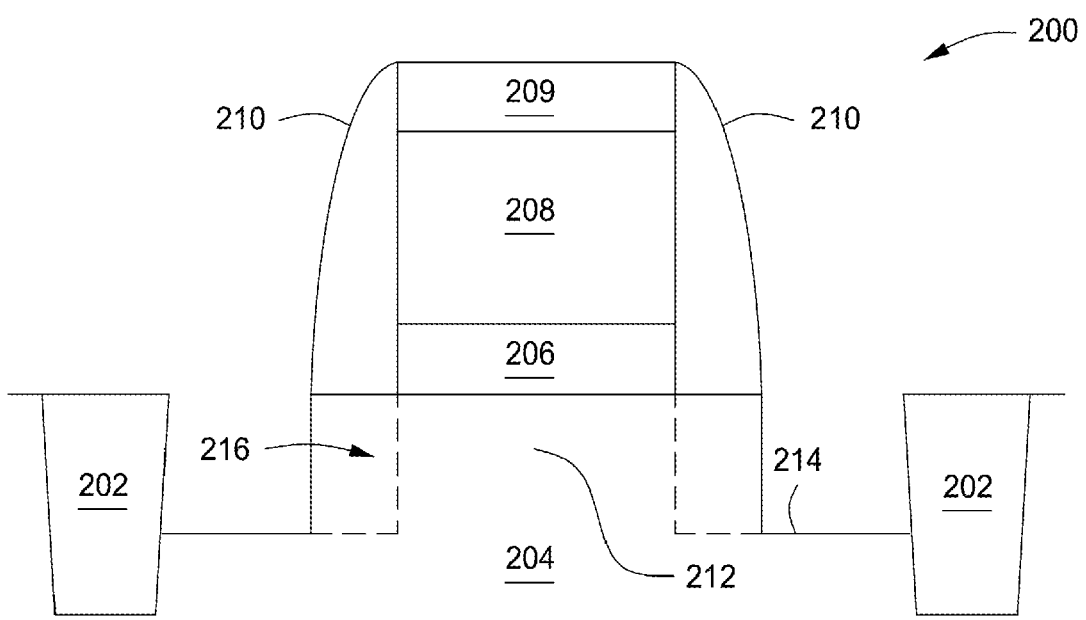

In some embodiments, for example, wherein the source/drain regions have not been defined in the substrate 200, the substrate 200 may be etched (as shown at 104 and in FIG. 2B). Specifically, the p-type region 204 of the substrate 200 may be etched to form source/drain regions 214 disposed on opposite sides of the gate stack 250, thereby defining a channel 212 of the transistor therebetween. In embodiments where the substrate 200 is etched, the hard mask layer 209 protects the gate electrode 208 from being etched.

In some embodiments, the substrate 200 may be etched vertically to form the source/drain regions 214 into the p-type region 204. Optionally, in some embodiments, and as shown by dotted lines in FIG. 2B, the substrate 200 may be etched laterally to form source/drain recesses 216, which extend horizontally beneath the sidewall spacers 210 and the gate dielectric layer 206. The horizontal etching may produce source/drain recesses 216 in the substrate 200 that extend beneath the gate dielectric layer 206, as shown in FIG. 2B.

The source/drain areas 214 (and optionally source/drain recesses 216) may have any suitable dimensions, for example, a depth of between about 5 nm and about 150 nm, and a width that may be as large as a distance between the isolation structure 202 to the gate dielectric 206, or less as necessary (such as, for example, between about 25 and about 2500 nm).

Figure 2C:
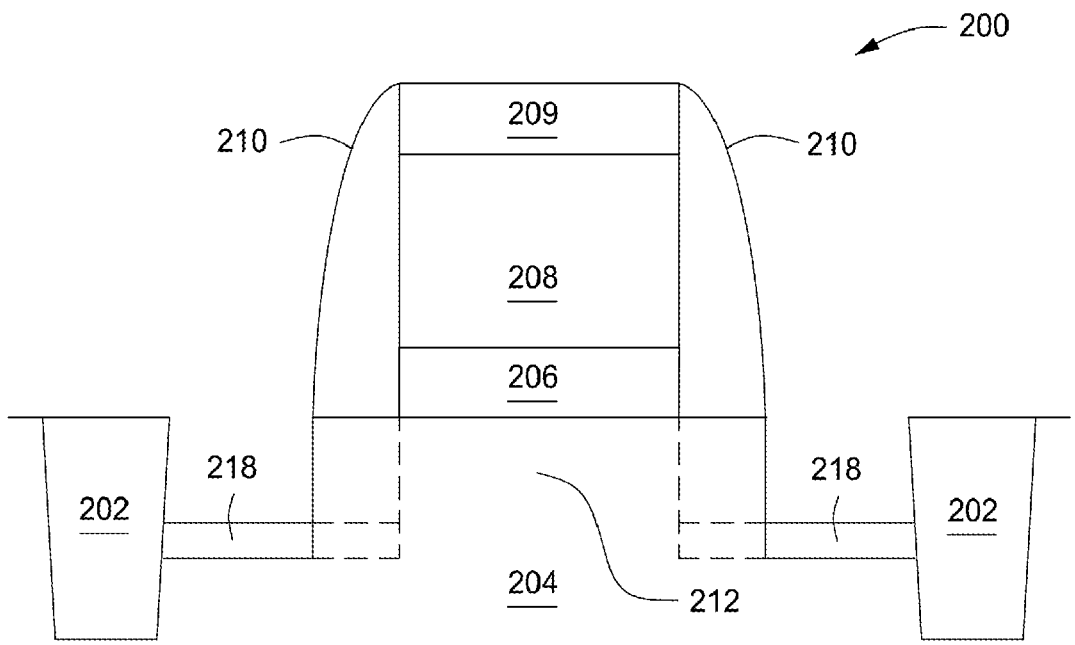
Figure 2D:
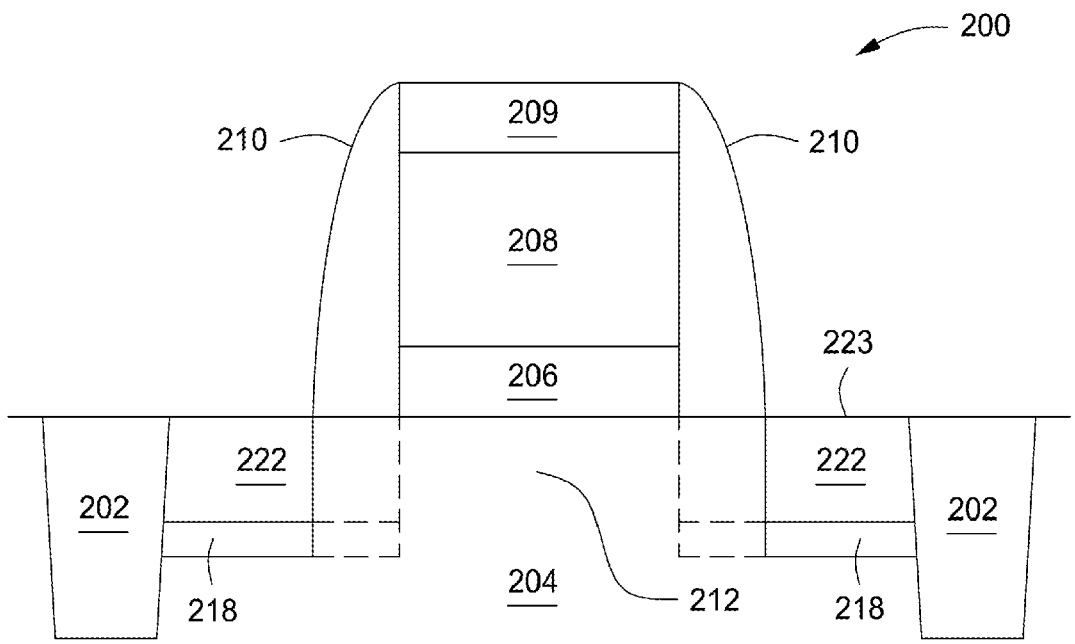

Next, at 106, an undoped first silicon layer 218 having a lattice adjusting element may be deposited on the substrate 200 within the source/drain regions 214 as shown in FIG. 2C. Optionally, and illustrated by dotted lines, the undoped first silicon layer 218 may be deposited within the source/drain recesses 216, when present. As used herein, undoped means not having an n-type dopant contained therein. The first silicon layer 218 may be deposited within the source/drain regions 214 and, when present, the source/drain recesses 216. The first silicon layer 218 may be formed to a thickness of between about 5-10 nm, or to about 30 nm. In some embodiments, the lattice adjusting element may comprise carbon, thereby forming a silicon-carbon film. A concentration of the lattice adjusting element in the first silicon layer 218 may range from about 0.1 to about 5.0 atomic percent. The first silicon layer 218 having the lattice adjusting element may facilitate providing an increased strain in the source/drain regions 214 and, when present, the source/drain recesses 216, thereby advantageously increasing the strain in the channel 212 of the transistor.

The first silicon layer 218 may be deposited by any suitable process, such as by selective epitaxial growth of the silicon layer. In some embodiments, a selective epitaxial growth process may involve a deposition reaction and an etch reaction. The deposition and etch reactions may occur simultaneously, where the etch reaction may have relatively different reaction rates for an epitaxial layer (e.g., first silicon layer 218) and a polycrystalline layer. During the deposition process, the epitaxial layer is formed on a monocrystalline surface (e.g., source/drain region 214 and/or source/drain recess 216) while a polycrystalline layer (not shown) is deposited on another surface, for example, on the sidewall spacers 210, the isolation structure 202, or the hard mask layer 209. However, the deposited polycrystalline layer is generally etched at a faster rate than the epitaxial layer. Therefore, the net selective epitaxial growth process results in deposition of the epitaxial layer and limited, or no, deposition of a polycrystalline layer. For example, a selective epitaxial growth process may result in the formation of the first silicon layer 218 on a surface of the source/drain region 214 and, when present, source/drain recess 216 while no deposition is left on the sidewall spacers 210, isolation structures 202, or hard mask layer 209.

For example, in some embodiments, the first silicon layer 218 may be epitaxially grown (e.g., within a suitable process chamber, such as described below) by providing a deposition gas mixture, and optionally, an etchant gas mixture. When an etchant gas mixture is used, the deposition gas mixture and etchant gas mixture may be flowed simultaneously or sequentially. In some embodiments, the deposition gas mixture and etchant gas mixture may be flowed sequentially (e.g., alternating deposition gas mixture and etchant gas mixture), where the sequence is repeated to achieve a first silicon layer 218 of a desired thickness. Exemplary alternating deposition and etch processes are disclosed in commonly assigned U.S. patent application Ser. No. 11/001,774, published as United States Patent Application Publication No. 2006/0115934, U.S. patent application Ser. No. 11/609,608, published as United States Patent Application Publication No. 2008/0138964, and U.S. patent application Ser. No. 11/609,590, published as United States Patent Application Publication No. 2008/0138955, the entire contents of which are incorporated herein by reference. The deposition gas mixture includes at least one of a silicon-containing gas or a lattice adjusting element containing gas, and may optionally further include a carrier gas. In some embodiments, the deposition gas mixture comprises the silicon-containing gas, the lattice adjusting element-containing gas, and the carrier gas. The etchant gas mixture includes an etchant gas and, optionally, a carrier gas.

The silicon-containing gas includes, but is not limited to, one or more of silanes, halogenated silanes, and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X_y'Si_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The lattice adjusting element-containing gas may include, but is not limited to, a carbon source such as one or more of organosilanes, alkyls, alkenes and alkynes of ethyl, propyl and butyl. Such carbon sources include methylsilane ($CH_3SiH_3$), dimethylsilane (($CH_3$)$_2SiH_2$), trimethylsilane (($CH_3$)$_3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others.

The etchant gas may include, but is not limited to, one or more of chlorine ($Cl_2$), hydrogen chloride (HCl), boron trichloride ($BCl_3$), methylchloride ($CH_3Cl$), carbon tetrachloride ($CCl_4$), chlorotrifluoride ($ClF_3$) and combinations thereof. In some embodiments the etchant gas includes at least $Cl_2$ or HCl.

The carrier gas may include nitrogen ($N_2$), hydrogen ($H_2$), argon, helium and combinations thereof. A carrier gas may be selected based the identity of the silicon-containing gas or lattice adjusting element-containing gas and/or the process temperature during the epitaxial process.

In some embodiments, the deposition gas mixture further comprises a first deposition gas mixture and a second deposition gas mixture, where the first and second deposition gas mixtures are flowed sequentially to deposit the first silicon layer 218. The first deposition gas may comprise the silicon-containing gas and the carrier gas. The second deposition gas may comprise the lattice adjusting element-containing gas and the carrier gas.

The first deposition gas mixture for the deposition of the first silicon layer 218 may be supplied at a total gas flow from about 1,005 to about 35,000 sccm, or at about 2,600 sccm. The first deposition gas mixture may utilize a range of compositions. In some embodiments, the first deposition gas mixture may comprise between about 0.05-50 percent of the silicon-containing gas (i.e., a silicon-containing gas flow of between about 5-500 sccm. In some embodiments, the first process gas mixture may comprise between about 50-99.95 percent of the carrier gas (i.e., a carrier gas flow of between about 1,000-30,000 sccm). For example, in one specific embodiment, the first deposition gas mixture contains the silicon-containing gas provided at a rate of about 100 sccm and a carrier gas provided at a rate of about 2,500 sccm.

The second deposition gas mixture is provided to continue the growth of the first silicon layer 218. The second deposition gas mixture includes the lattice adjusting element-containing gas and the carrier gas. The lattice adjusting element is usually provided into the process chamber at a rate in the range from about 0.1-20 sccm, or about 0.5 sccm to about 10 sccm, or from about 1 sccm to about 5 sccm, or, for example, about 2 sccm.

In some embodiments, the first and second deposition gas mixture may be followed sequentially by the etchant gas mixture. The sequential flow of the first deposition gas mixture, the second deposition gas mixture and the etchant gas mixture may be repeated until a desired thickness of the first silicon layer 218 is achieved.

During processing the substrate may be exposed to the etchant gas mixture for about 10-90 seconds to deposit the first silicon layer 218. The etchant gas mixture may utilize a range of compositions. In some embodiments, the etchant gas mixture may comprise between about 0.1-70 percent of the etchant gas (i.e., an etchant gas flow of between about 10-700 sccm). In some embodiments, the second deposition gas mixture may comprise between about 30-99.9 percent of a carrier gas (i.e., an carrier gas flow of between about 1,000-10,000 sccm). For example, in one specific embodiment, the etchant gas mixture contains an etchant gas is provided at a rate of about 200 sccm, and a carrier gas is provided at a rate of about 2,500 sccm.

The temperature and pressure within the process chamber may be regulated during processing to maintain an environment suitable for the deposition of the first silicon layer 218. The temperature may be controlled in a range of between about 500-650 degrees Celsius. In some embodiments, the temperature may be maintained at about 550 degrees Celsius. The pressure may be maintained in range of between about 10-650 Torr.

Next, at 108, one or more second silicon layers (e.g., silicon layer 222 depicted in FIG. 2D) having a lattice adjusting element and an n-type dopant may be deposited atop the first silicon layer 218 in the source/drain region 214 and, when present, the source/drain recess 216. In some embodiments a single second silicon layer 222 may be provided. In some embodiments, a plurality of second silicon layers 222 may be provided (not shown). The plurality of second silicon layers may have varying concentrations of the n-type dopant contained within each layer, as discussed in more detail below. The thickness of the one or more second silicon layers 222 may vary as required to fill the source/drain regions 214 and, when present, the source/drain recesses 216. For example, where a single second silicon layer is provided, the thickness may be between about 20-100 nm, or about 60 nm. In some embodiments where a plurality of second silicon layers 222 are provided, each layer may be formed to a thickness of between about 20-70 nm, or about 30 nm.

The lattice adjusting element may be the same as the lattice adjusting element discussed above with respect to the first silicon-containing layer 218. The n-type dopant may comprise at least one of phosphorus, arsenic, or the like. In some embodiments, the lattice adjusting element may be carbon, and the n-type dopant may be phosphorus. The one or more second silicon layers 222 having both the lattice adjusting element and the n-type dopant may facilitate providing a low junction series resistance in the remaining bulk of the source/drain region.

As such, a source/drain region may be formed that provides a high channel strain set by the undoped first silicon layer having the lattice adjusting element and a low series resistance due to the second silicon layer having both the lattice adjusting element and the n-type dopant. The thermal budget of the epitaxial deposition process should be sufficient to provide necessary diffusion of the n-type dopant into the first silicon layer 218. Moreover, as there are no ion implantation steps, the as-grown substituted lattice adjusting element (e.g., carbon) percentage may be more or less retained in all layers (e.g., due to not being driven out by the ion implantation process). It is believed that the primary driver of the channel strain is achieved at the interface between the source/drain region and the underlying substrate. As such, the first silicon layer 218 may be provided to set the strain and subsequent one or more second silicon layers may be provided to form the remainder of the source/drain region having a lowered series resistance while retaining all or most of the strain properties set by the first silicon layer 218.

A concentration of the lattice adjusting element in the second silicon layer 222 may range from about 0.1 to about 5.0 atomic percent. A concentration of the n-type dopant in the second silicon layer 222 may range from about 0.02 to about 2.0 atomic percent.

The one or more second silicon layers 222 may be selectively deposited on the p-type region 204, such as, in the source/drain area 214 and the source/drain recess 216 and in an etched portion 217 of the gate electrode 208 in a sufficient amount to fill the source/drain area 214 and the source/drain recess 216. Alternatively, the one or more second silicon layers 222 may be deposited in excess amounts to form a protrusion above the level of the gate dielectric material 206 (not shown), referred to as a "raised" source/drain region.

The one or more second silicon layers 222 may be deposited atop the first silicon layer 218 by any suitable process, such as by epitaxial growth of the silicon layer. In some embodiments, the concentration of either or both of a lattice adjusting element and/or n-type dopant in the one or more second silicon layers 222 may be varied during the growth process. For example, in some embodiments, the second silicon layer 222 may be epitaxially grown (e.g., within a suitable process chamber, such as described below) by providing a second process gas mixture comprising a silicon-containing gas, a lattice adjusting element-containing gas, an n-type dopant-containing gas, and, optionally, an inert gas. The silicon-containing gases may comprise any one or more of the silicon-containing gases discussed above for depositing the first silicon layer 218. The lattice adjusting element-containing gas may comprise the same lattice adjusting element-containing gases discussed above for depositing the first silicon layer 218. The n-type dopant-containing gas may comprise at least one of arsine ($AsH_3$), phosphine ($PH_3$) or alkylphosphines, such as with the empirical formula $R_x PH_{(3-x)}$, where R=methyl, ethyl, propyl or butyl and x=1, 2 or 3. Alkylphosphines may include trimethylphosphine (($CH_3$)$_3$P), dimethylphosphine (($CH_3$)$_2$PH), triethylphosphine (($CH_3CH_2$)$_3$P), diethylphosphine (($CH_3CH_2$)$_2$PH), or the like. The inert gas may comprise any one or more of the inert gases discussed above for depositing the first silicon layer 218. In some embodiments, the silicon-containing gas comprises silane, disilane, DCS, the lattice adjusting element-containing gas comprises methyl silane, and, optionally, the inert gas comprises $H_2$ or $N_2$.

The second process gas mixture for the deposition of the one or more second silicon layers 218 may be supplied at a total gas flow of about 10,000 sccm. The second process gas mixture may utilize a range of compositions. In some embodiments, the second process gas mixture may have a silicon-containing gas flow of about 300 sccm). In some embodiments, the second process gas mixture may have a lattice adjusting element-containing gas flow of between about 50 to about 100 sccm). In some embodiments, the second process gas mixture may have an n-type dopant-containing gas flow of about 300 sccm).

The temperature and pressure within the process chamber may be regulated during processing to maintain an environment suitable for the deposition of the one or more second silicon layers 222. The temperature may be controlled in a range of between about 500-1200 degrees Celsius. In some embodiments, the temperature may be maintained at less than about 650 degrees Celsius. The pressure may be maintained in range of between about 0.1-600 Torr. In some embodiments, the pressure may be maintained at about 10 Torr.

As discussed above, in some embodiments, a plurality of second silicon layers 222 may be formed within the source/drain area 214 and, when present, the source/drain recess 216. The plurality of second silicon layers 222 may further comprise a bottom layer deposited directly atop the first silicon layer 218 and at least a top layer being the final second silicon layer deposited in the plurality. Other layers may be deposited between the bottom and top layers.

The concentration of the lattice adjusting element and the n-type dopant in the plurality of second silicon layers 222 may be graded between the bottom layer and the top layer. The term "graded" as used herein means that the concentration of the graded species varies in either an increasing or decreasing manner between the top layer and the bottom layer. The rate of change of the concentrations of the lattice adjusting element and the n-type dopant in the plurality of second silicon layers 222 may be linear or non-linear.

In some embodiments, the concentration of the lattice adjusting element may be the same, or may vary between the bottom layer and the top layer of the plurality of second silicon layers 222. In some embodiments, the concentration of the lattice adjusting element may decrease between the bottom layer and the top layer of the plurality of second silicon layers 222. The concentration of the lattice adjusting element in the bottom layer may be between about 0.1-2.5 atomic percent, or about 1.3 atomic percent. The concentration of the lattice adjusting element in the top layer may be between about 0.1-2 atomic percent, or about 1 atomic percent.

In some embodiments, the concentration of the n-type dopant may increase between the bottom layer and the top layer of the plurality of second silicon layers 222. The concentration of the n-type dopant in the bottom layer may be between about 0.0-1.0, or about 0.3 atomic percent. The concentration of the n-type dopant in the top layer may be between about 0.5-4.0, or about 2.5 atomic percent.

To deposit the plurality of second silicon layers 222 having graded concentrations of the lattice adjusting element and the n-type dopant, the relative percentages of the respective gases in the second process gas mixture may be varied accordingly within the ranges given above to achieve the desired concentrations. One or more of a lattice adjusting element decrease and a dopant increase in a direction from the bottom of the layer to the top may be provided.

After deposition of the first silicon layer 218 and one or more second silicon layers 222, the method generally ends, and additional fabrication steps may be performed to complete fabrication of the structure or device being formed. For example, further fabrication steps may include depositing a second set of sidewall spacers (not shown) to further isolate the gate electrode 208 from the source/drain region. The source/drain region comprises those regions formed by the deposition of the first silicon layer 218 and the second silicon layer 222. The second set of sidewall spacers may be deposited by the same process and same materials as described for sidewall spacers 210. The source/drain region may be etched prior to the deposition of the second set of sidewall spacers to provide sufficient isolation for the gate electrode 208.

In some embodiments, an optional fabrication step (not shown) may involve a salicidation process to form a low resistance silicide atop the deposited second silicon layer 222. The silicide formation process may be one conventionally known in the art, such as cobalt and titanium nitride deposition and anneal to form a cobalt silicide. Other materials, such as nickel for nickel silicide, and other metals suitable for silicide formation may be used to form the silicide herein.

The NMOS devices and methods of fabrication provided above is illustrative only and many variations are possible within the scope of the present invention. For example, varying dimensions of the structures may be provided, the first and one or more second silicon layers may be formed either before (not shown) or after (as shown) the formation of the gate dielectric and gate electrode, the first and one or more second silicon layers may be formed on a substrate that has pre-doped source/drain regions formed therein, or the like. For example, in some embodiments, and as illustrated in FIGS. 3A-D, an NMOS transistor in accordance with the present invention may be formed, using the process 100, on a substrate having a partially fabricated NMOS transistor device with existing source/drain regions.

Figure 3A:
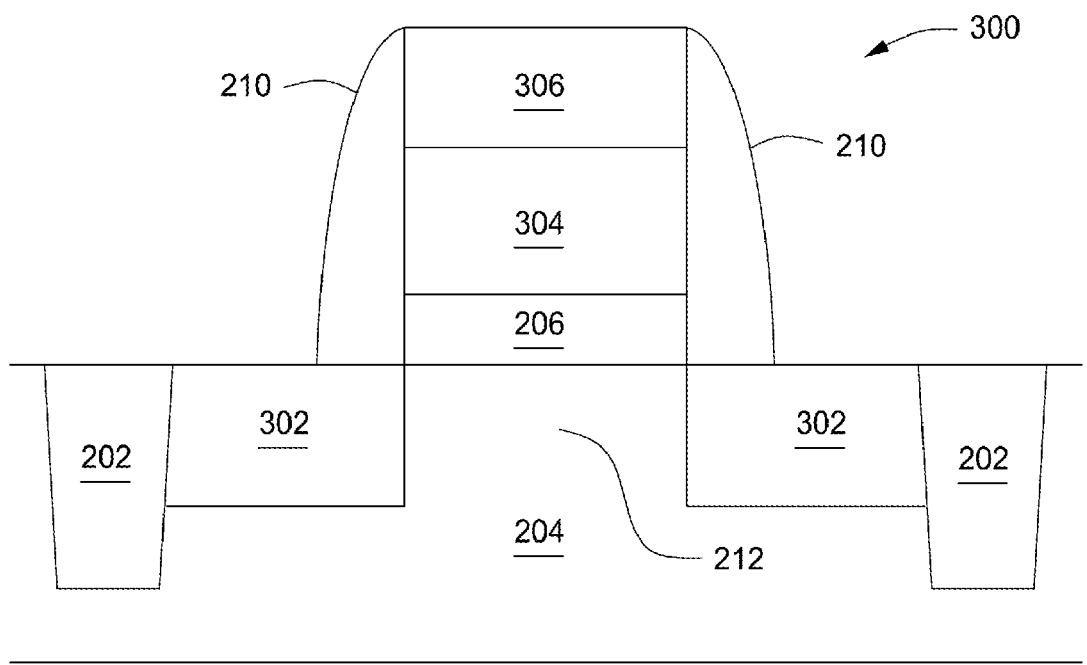
FIGS. 3A-D depict stages of fabrication of a source/drain region in accordance with some embodiments of the method of FIG. 1.

For example, FIG. 3A illustrates a substrate 300 which may be provided at 102 of the process 100. The substrate 300 may include a partially fabricated n-type metal oxide semiconductor device (NMOS) disposed thereon. The NMOS transistor has an n-type source/drain region separated by a p-type channel. The substrate 300 includes many similar features as described above with respect to the substrate 200, which are numbered identically, and which may be the same as described above with respect to FIGS. 2A-D unless specifically disclosed otherwise.

The substrate 300 includes a plurality of field isolation regions 202 and a p-type region 204 formed between the isolation regions 202. A gate dielectric layer 206 may be formed on the top surface of p-type region 204. The gate dielectric layer 206 may be formed to a thickness of between about 0.5-10 nm. A gate electrode 304 may be formed on the gate dielectric layer 206. The gate electrode 304 may be formed from suitable conductive materials, such as polysilicon, or metals. The gate electrode 304 may be formed to a thickness of, for example, between about 100 nm and about 350 nm.

The exposed surface of the p-type region 204 on opposing sides of the gate electrode and the exposed upper surface of the gate electrode 304 may be implanted with n-dopant ions. The dopant ions may, for example, be phosphorus ions or other suitable n-type ions. The ions form conductive n-doped regions 302 in the p-type region 204 and a conductive n-doped region 306 in the gate electrode 304. The n-doped regions 302 form initial source/drain regions for the structure and have an n-type conductivity different than the p-type region 204.

Sidewall spacers 210 may be formed along the outer sidewalls of the gate electrode 208 and the gate dielectric layer 304 (and conductive n-doped region 306), as shown in FIG. 3A. Optionally (not shown), the sidewall spacers 210 may be etched to remove at least a portion of the sidewall spacers 210 to form reduced thickness sidewall spacers. Alternatively, the entire sidewall spacers 210 may be removed (not shown), for example, in embodiments where the source/drain region extend under the gate dielectric 206. The etching of the sidewalls spacers may also result in a reduced doped polysilicon gate portion 306. Optionally, a hard mask (not shown) may be deposited on the source/drain region 302 and n-doped region 306 to prevent loss of material during etching of the sidewall spacers 210. The hard mask material may be any material used in hard mask application, including, for example, silicon oxide or silicon nitride, and may be deposited by any process including, for example, enhanced chemical vapor deposition (PECVD) and low pressure chemical vapor deposition (LPCVD).

Figure 3B:
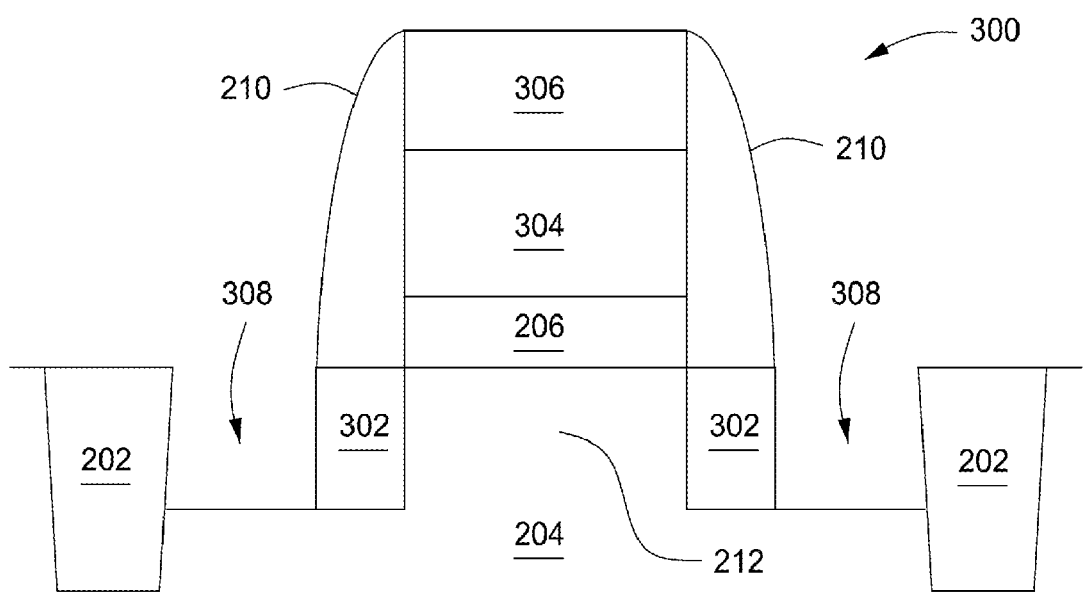

Next, at 104, the p-type region 204 including at least a portion of the n-doped regions 302 may be etched to define a source/drain area 308 that are disposed on opposite sides of the gate electrode 304 and adjacent the sidewall spacers 210 (as depicted in FIG. 3B). In some embodiments, the region 204 can be anisotropically etched (i.e., etched uniformly in one direction). In some embodiments, the region 204 can be isotropically etched (i.e., etched uniformly in all directions). Sufficient isotropic etching may produce recesses (not shown, but similar to those depicted by dotted lines in FIGS. 2A-D) that may extend under the sidewall spacers 210.

The anisotropic etch process may form a substantially vertical sidewall and bottom of the source/drain areas 308, as shown in FIG. 3B. Alternatively, the areas 308 may have a concave or other desired geometry (not shown). A portion of the n-doped regions 302 may remain after forming the source/drain areas 308. The source/drain areas 308 may have any suitable dimensions, such as, for example, a depth of between about 5 nm and about 150 nm and a width that may range from the isolation structures 202 to the outer portion of the sidewall spacers 210. The etch process may also remove a portion of the reduced doped polysilicon gate portion 306. A hard mask (not shown) may be deposited on portions of the structure, for example, the conductive n-doped region 306 of the gate electrode 304, the gate dielectric 206, the sidewall spacers 210, or the like, to prevent loss of material during the etching process.

Figure 3C:
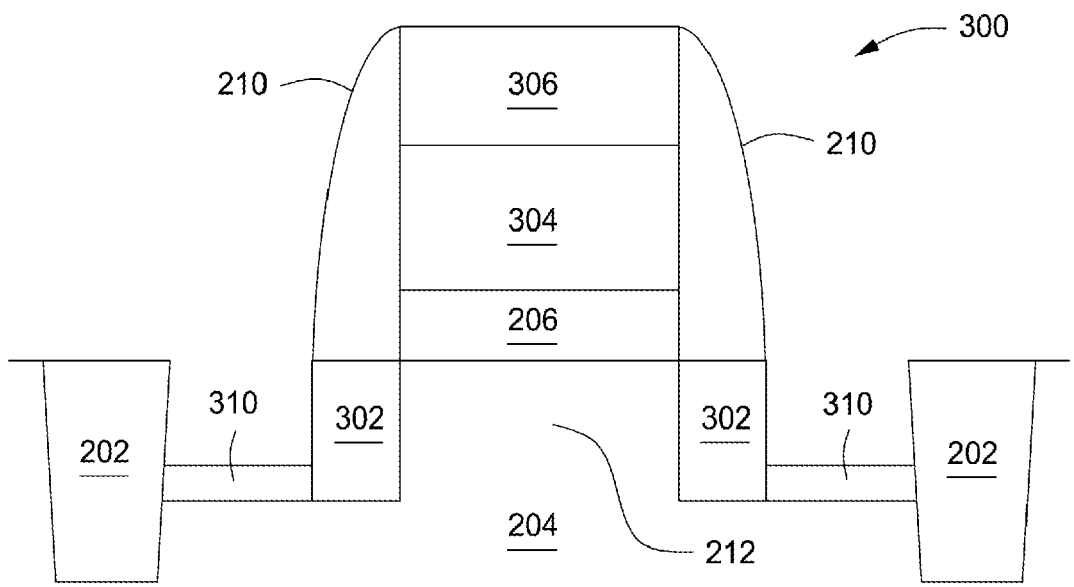
Figure 3D:
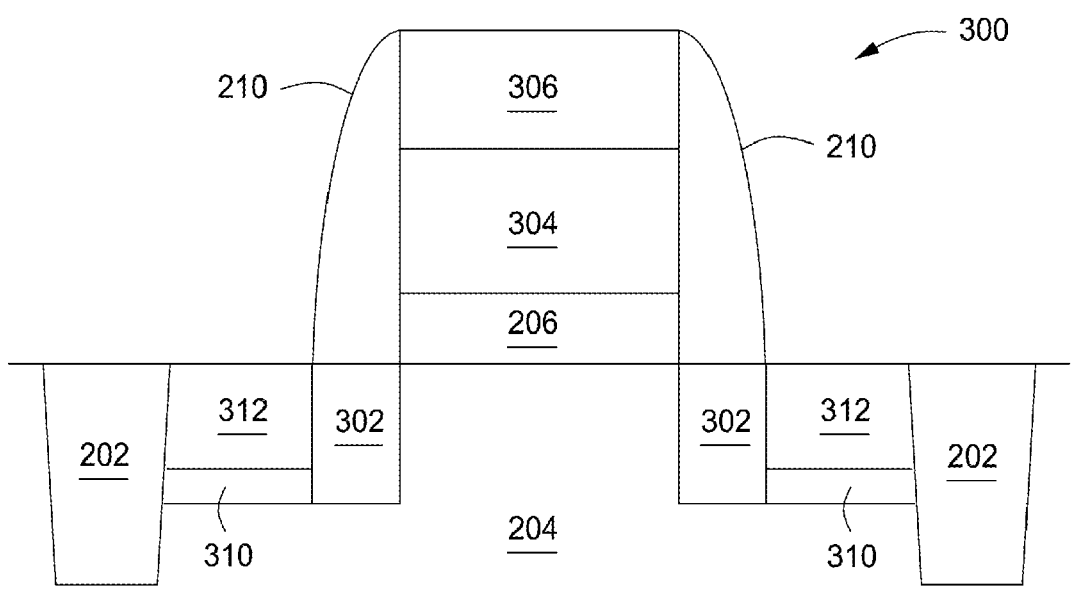

Next, at 106, the source/drain areas 308 may then be partially filled with a first silicon layer 310 as shown in FIG. 3C (similar to the first silicon layer 218). At 108, one or more second silicon layers 312 (similar to the one or more silicon layers 222) may be formed to fill in the remainder of the source/drain areas 308, as shown in FIG. 3D. The materials and methods for forming the first silicon layer 310 and the one or more second silicon layers 312 are identical to those described above with respect to the first and second silicon layers 218, 222. The residual portions of the n-doped regions 302 may be absorbed into the first silicon layer 310 and the second silicon layer 312 to form a more laterally uniform source/drain region.

The substrate 300 may be subjected to alternative process embodiments such as a raised source/drain extension. Additionally, substrate 300 may be subjected to processing such as anneal, a capping layer, and/or a salicidation process as described for substrate 200.

The inventive processes disclosed herein may be performed in any suitable semiconductor process chamber adapted for performing epitaxial silicon deposition processes, such as the RP EPI® reactor, available from Applied Materials, Inc. of Santa Clara, Calif. An exemplary process chamber is described below with respect to FIG. 4, which depicts a schematic, cross-sectional view of a semiconductor substrate process chamber 400 suitable for performing portions of the present invention. The process chamber 400 may be adapted for performing epitaxial silicon deposition processes as discussed above and illustratively comprises a chamber body 410, support systems 430, and a controller 440.

The chamber body 410 generally includes an upper portion 402, a lower portion 404, and an enclosure 420. The upper portion 402 is disposed on the lower portion 404 and includes a lid 406, a clamp ring 408, a liner 416, a baseplate 412, one or more upper lamps 436 and one or more lower lamps 438, and an upper pyrometer 456. In one embodiment, the lid 406 has a dome-like form factor, however, lids having other form factors (e.g., flat or reversecurve lids) are also contemplated. The lower portion 404 is coupled to a process gas intake port 414 and an exhaust port 418 and comprises a baseplate assembly 421, a lower dome 432, a substrate support 424, a pre-heat ring 422, a substrate lift assembly 460, a substrate support assembly 464, one or more upper lamps 452 and one or more lower lamps 454, and a lower pyrometer 458. Although the term "ring" is used to describe certain components of the process chamber, such as the pre-heat ring 422, it is contemplated that the shape of these components need not be circular and may include any shape, including but not limited to, rectangles, polygons, ovals, and the like.

During processing, a substrate 425 is disposed on the substrate support 424. The lamps 436, 438, 452, and 454 are sources of infrared (IR) radiation (i.e., heat) and, in operation, generate a pre-determined temperature distribution across the substrate 425. The lid 406, the clamp ring 416, and the lower dome 432 are formed from quartz; however, other IR-transparent and process compatible materials may also be used to form these components.

The substrate support assembly 464 generally includes a support bracket 434 having a plurality of support pins 466 coupled to the substrate support 424. The substrate lift assembly 460 comprises a substrate lift shaft 426 and a plurality of lift pin modules 461 selectively resting on respective pads 427 of the substrate lift shaft 426. In one embodiment, a lift pin module 461 comprises an optional upper portion of the lift pin 428 is movably disposed through a first opening 462 in the substrate support 424. In operation, the substrate lift shaft 426 is moved to engage the lift pins 428. When engaged, the lift pins 428 may raise the substrate 425 above the substrate support 424 or lower the substrate 425 onto the substrate support 424.

The support systems 430 include components used to execute and monitor pre-determined processes (e.g., growing epitaxial silicon films) in the process chamber 400. Such components generally include various sub-systems. (e.g., gas panel(s), gas distribution conduits, vacuum and exhaust subsystems, and the like) and devices (e.g., power supplies, process control instruments, and the like) of the process chamber 400. These components are well known to those skilled in the art and are omitted from the drawings for clarity.

Figure 4:
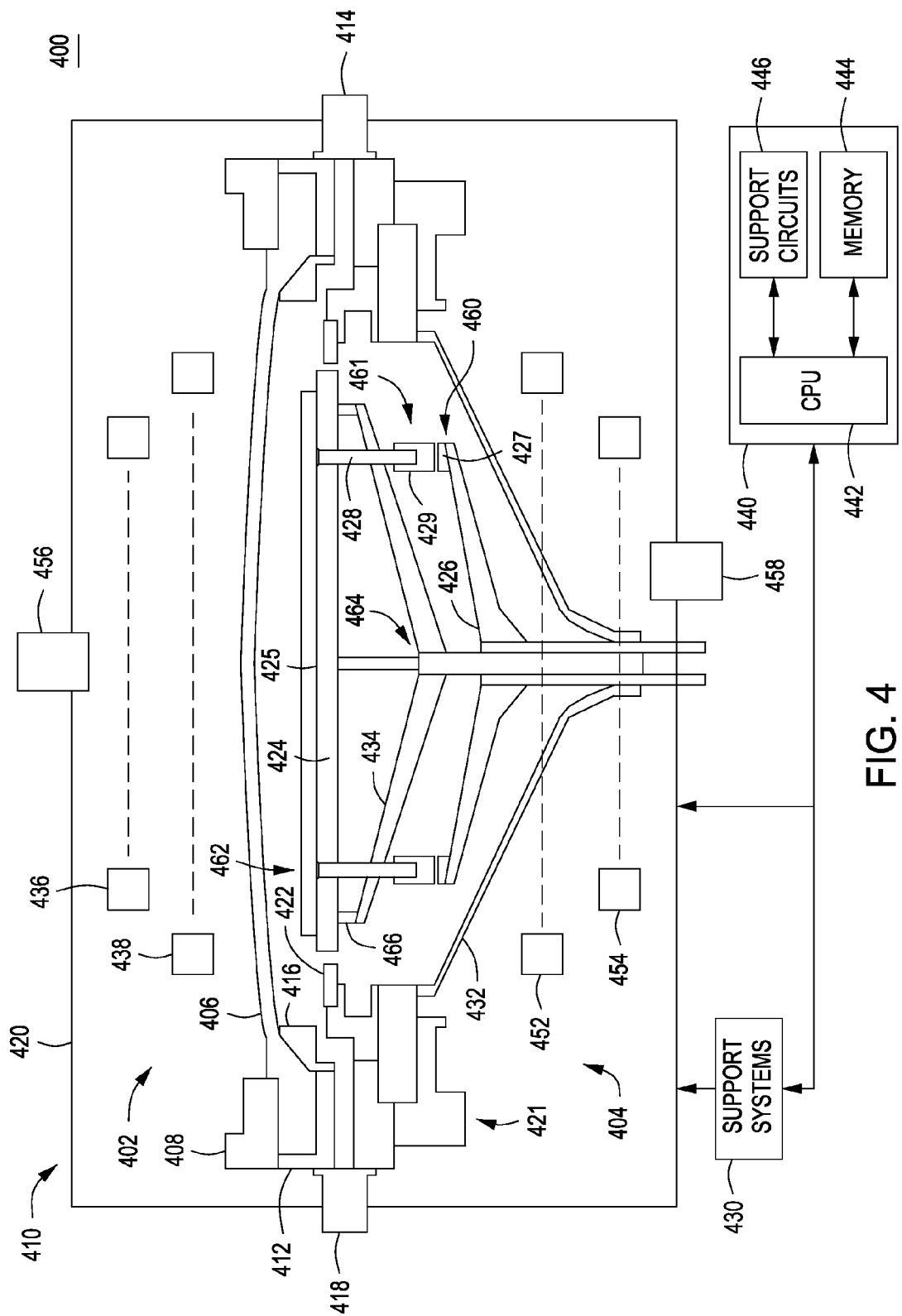
FIG. 4 depicts a schematic, cross-sectional view of a semiconductor substrate process chamber suitable for performing portions of the present invention.

The controller 440 generally comprises a central processing unit (CPU) 442, a memory 444, and support circuits 446 and is coupled to and controls the process chamber 400 and support systems 430, directly (as shown in FIG. 4) or, alternatively, via computers (or controllers) associated with the process chamber and/or the support systems.

The process chamber 400 may be incorporated into a cluster tool. One well-known cluster tools which may be adapted for the present invention is the Centura®, which is available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present epitaxial growth process.

Figure 5:
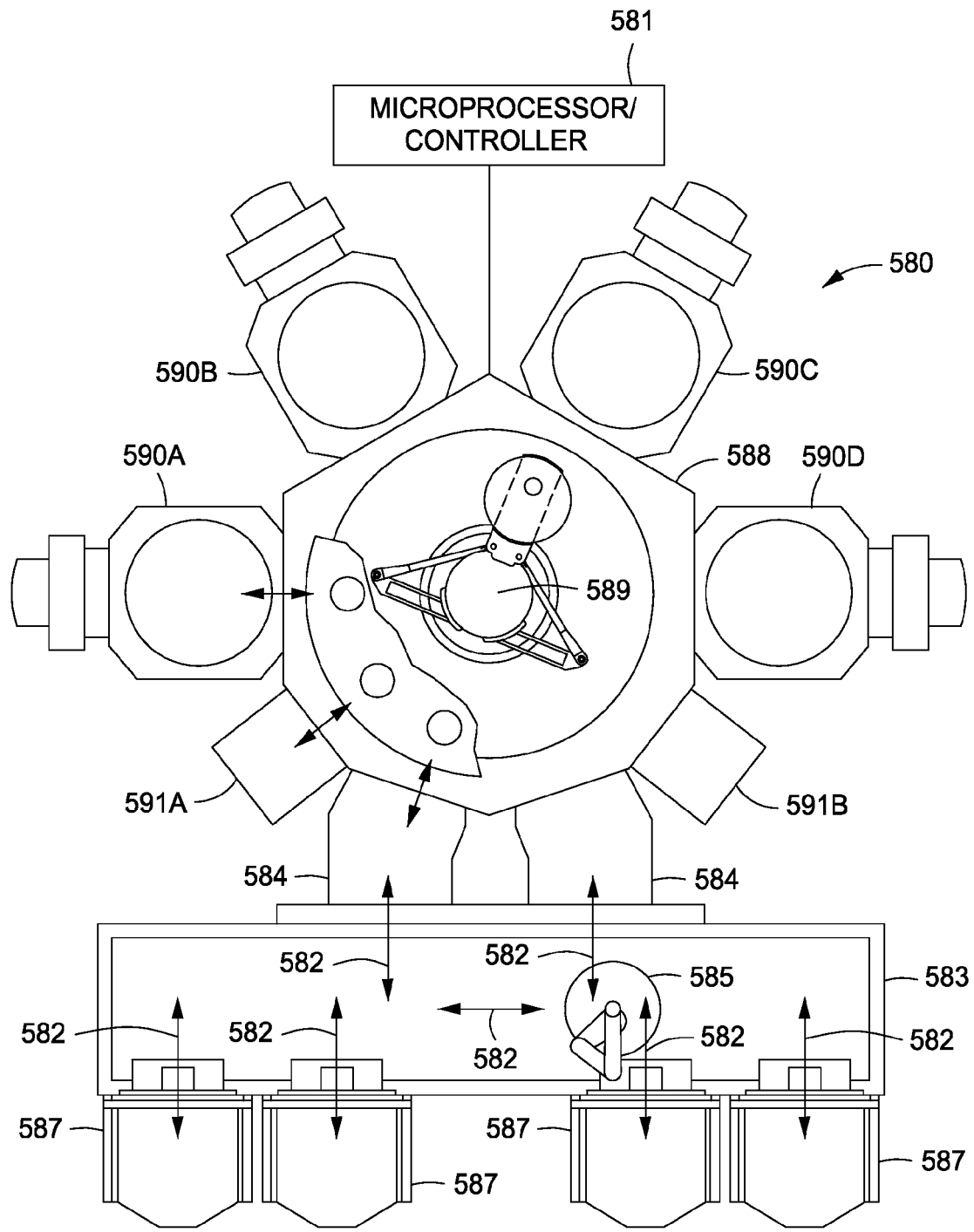
FIG. 5 depicts a cluster tool suitable for performing portions of the present invention.

FIG. 5 depicts a cluster tool suitable for performing portions of the present invention. Generally, the cluster tool is a modular system comprising multiple chambers (e.g., process chambers 590A-D, service chambers 591A-B, or the like) which perform various functions including substrate center-finding and orientation, degassing, annealing, deposition and/or etching. According to embodiments of the present invention, the cluster tool may include at least a semiconductor substrate process chamber configured to perform the inventive epitaxial growth of the source/drain region and may further include chambers such as ion implantation chambers, etch chambers, and the like. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 580 is shown in a plan view in FIG. 5. The cluster tool 580 generally comprises a plurality of chambers and robots and is preferably equipped with a microprocessor controller 581 programmed to carry out the various processing methods performed in the cluster tool 580. A front-end environment 583 is shown positioned in selective communication with a pair of load lock chambers 584. A pod loader 585 disposed in the front-end environment 583 is capable of linear and rotational movement (arrows 582) to shuttle cassettes of substrates between the load locks 584 and a plurality of pods 587 which are mounted on the front-end environment 583. The load locks 584 provide a first vacuum interface between the front-end environment 583 and a transfer chamber 588. Two load locks 584 are provided to increase throughput by alternatively communicating with the transfer chamber 588 and the front-end environment 583. Thus, while one load lock 584 communicates with the transfer chamber 588, a second load lock 584 communicates with the front-end environment 583. A robot 589 is centrally disposed in the transfer chamber 588 to transfer substrates from the load locks 584 to one of the various processing chambers 590A-D and service chambers 591A-B. The processing chambers 590A-D may perform various processes such as physical vapor deposition, chemical vapor deposition, etching, and the like, while the service chambers 591 may be adapted for degassing, orientation, cooldown, and the like.

For the purposes of practicing embodiments of the present invention, at least one of the processing chambers (for example, 590A) may be configured similar to the exemplary semiconductor substrate process chamber 400, illustrated in FIG. 4. Another at least one of the processing chambers (for example, 590B) may be a plasma etch chamber adapted to etch source/drain area and source/drain recesses in the p-type region in accordance with embodiments of the present invention. Accordingly, following an etch of the source/drain area and source/drain recesses, the substrate may be removed from the plasma etch chamber and transported to the process chamber 590A by the robot 589 to form the first and one or more second silicon layers.

Thus, NMOS transistors and methods for the formation of the same have been provided herein. The inventive NMOS transistors and methods may advantageously improve electron mobility and junction resistance in the transistor device. Thus, the present inventive processes may facilitate a larger process window and the types of processes that may be utilized to grow a source/drain region in a NMOS transistor having the favorable characteristics of both increased tensile stress applied to the channel region, and improved junction resistance at the interface of the source/drain region and other components of the transistor device.

While the foregoing is directed to embodiments of the present invention, other and further embodiments of the invention may be devised without departing from the basic scope thereof, and the scope thereof is determined by the claims that follow.

What is claimed is:

1. An n-type metal oxide semiconductor (NMOS) transistor, comprising:
   a transistor stack comprising a gate dielectric and a gate electrode formed atop a p-type silicon region of a semiconductor substrate; and
   a source/drain region disposed on both sides of the transistor stack and defining a channel region therebetween and beneath the transistor stack, the source/drain region comprising a first silicon layer having a lattice adjusting element and a plurality of second silicon layers having a lattice adjusting element and an n-type dopant disposed atop the first silicon layer, wherein the concentration of the n-type dopant either increases from a bottom layer of the plurality of second silicon layers to a top layer of the plurality of second silicon layers, or wherein the concentration of the lattice adjusting element decreases from a bottom layer of the plurality of second silicon layers to a top layer of the plurality of second silicon layers.

2. The NMOS transistor of claim 1, wherein the lattice adjusting element is carbon.

3. The NMOS transistor of claim 1, wherein the n-type dopant comprises at least one of phosphorus or arsenic.

4. The NMOS transistor of claim 1, wherein the concentration of the lattice adjusting element in the first silicon layer is about 0.1 to about 5 atomic percent.

5. The NMOS transistor of claim 4, wherein the lattice adjusting element is carbon.

6. The NMOS transistor of claim 4, wherein the concentration of the lattice adjusting element in the plurality of second silicon layers is about 0.1 to about 5 atomic percent.

7. The NMOS transistor of claim 4, wherein the concentration of the n-type dopant in the plurality of second silicon layers is about 0.1 to about 4.0 atomic percent.

8. The NMOS transistor of claim 1, wherein the concentration of the lattice adjusting element in the plurality of second silicon layers is about 0.1 to about 5 atomic percent.

9. The NMOS transistor of claim 8, wherein the concentration of the n-type dopant in the plurality of second silicon layers is about 0.1 to about 4.0 atomic percent.

10. The NMOS transistor of claim 1, wherein the concentration of the n-type dopant in the plurality of second silicon layers is about 0.1 to about 4.0 atomic percent.

11. The NMOS transistor of claim 1, wherein the plurality of second silicon layers further comprises about 1.0 to about 2.5 atomic percent of the lattice adjusting element, and about 0.0 to about 4.0 atomic percent of the n-type dopant.

12. The NMOS transistor of claim 11, wherein the lattice adjusting element is carbon.

13. The NMOS transistor of claim 11, wherein the n-type dopant is at least one of phosphorus or arsenic.

14. The NMOS transistor of claim 1, wherein the concentration of the n-type dopant increases from a bottom layer of the plurality of second silicon layers to a top layer of the plurality of second silicon layers.

15. The NMOS transistor of claim 14, wherein the concentration of the n-type dopant is about 0.0 to about 1.0 atomic percent in the bottom layer and about 0.5 to about 4.0 atomic percent in the top layer.

16. The NMOS transistor of claim 14, wherein the concentration of the n-type dopant is about 0.3 atomic percent in the bottom layer and about 2.5 atomic percent in the top layer.

17. The NMOS transistor of claim 1, wherein the concentration of the lattice adjusting element decreases from a bottom layer of the plurality of second silicon layers to a top layer of the plurality of second silicon layers.

18. The NMOS transistor of claim 17, wherein the concentration of the n-type dopant is about 0.1 to about 2.5 atomic percent in the bottom layer and about 0.1 to about 2.0 atomic percent in the top layer.

19. The NMOS transistor of claim 17, wherein the concentration of the n-type dopant is about 1.3 atomic percent in the bottom layer and about 1.0 atomic percent in the top layer.

* * * * *